(12) United States Patent
Trim et al.

(10) Patent No.: US 11,991,855 B2
(45) Date of Patent: *May 21, 2024

(54) SYSTEM AND METHOD FOR MEASURING AND CONTROLLING DUST INGRESS IN A PARTICULATE MATTER SENSOR IN AN INFORMATION HANDLING SYSTEM

(71) Applicant: DELL PRODUCTS, LP, Round Rock, TX (US)

(72) Inventors: James D. Trim, Pflugerville, TX (US); Jace W. Files, Round Rock, TX (US); John T. Morrison, Round Rock, TX (US); Sajjad Ahmed, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 572 days.

This patent is subject to a terminal disclaimer.

(21) Appl. No.: 17/153,203

(22) Filed: Jan. 20, 2021

(65) Prior Publication Data
US 2022/0232730 A1    Jul. 21, 2022

(51) Int. Cl.
*H05K 7/20* (2006.01)
*H05K 5/03* (2006.01)

(52) U.S. Cl.
CPC ......... *H05K 7/20209* (2013.01); *H05K 5/03* (2013.01); *H05K 7/20172* (2013.01)

(58) Field of Classification Search
CPC ... H06K 7/20209; H06K 7/20172; H05K 5/03

USPC ........................................... 700/300
See application file for complete search history.

(56) References Cited

U.S. PATENT DOCUMENTS

| | | | |
|---|---|---|---|
| 8,204,786 B2 | 6/2012 | LeBoeuf et al. | |
| 9,845,805 B2 * | 12/2017 | Bhutani | G06F 1/20 |
| 2006/0087395 A1 | 4/2006 | Bargholtz et al. | |
| 2009/0265045 A1 * | 10/2009 | Coxe, III | G06F 1/20 |
| | | | 700/300 |
| 2016/0109890 A1 * | 4/2016 | Styron | F01P 7/16 |
| | | | 236/34.5 |
| 2017/0067747 A1 | 3/2017 | Ricci | |
| 2019/0235982 A1 * | 8/2019 | North | G06F 1/203 |
| 2019/0310693 A1 * | 10/2019 | Mugunda | G06F 1/206 |
| 2021/0051823 A1 * | 2/2021 | Naghib Lahouti | |
| | | | H05K 7/20145 |

* cited by examiner

*Primary Examiner* — Md Azad
(74) *Attorney, Agent, or Firm* — Larson Newman, LLP

(57) ABSTRACT

An information handling system includes a fan to cool a component of the information handling system, and a sensor device. The fan includes a first fan inlet, a second fan inlet, and a fan outlet. The fan is configured to draw air into the first and second fan inlets and to blow air out the fan outlet. The sensor device includes a sensor inlet, a sensor outlet, and a cover. The sensor is coupled to the fan with the first fan inlet collocated with the sensor outlet such that air drawn into the first fan inlet is first drawn through the sensor inlet. The cover is configured in a first position to cover the sensor inlet to permit no air flow through the sensor inlet and in a second position to uncover the sensor inlet to permit air to flow through the sensor inlet.

20 Claims, 6 Drawing Sheets

SYSTEM AND METHOD FOR MEASURING AND CONTROLLING DUST INGRESS IN A PARTICULATE MATTER SENSOR IN AN INFORMATION HANDLING SYSTEM

FIELD OF THE DISCLOSURE

This disclosure generally relates to information handling systems, and more particularly relates to measuring and controlling dust ingress in a particulate matter sensor in an information handling system.

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

An information handling system may include a fan to cool a component of the information handling system, and a sensor device. The fan may include a first fan inlet, a second fan inlet, and a fan outlet. The fan may draw air into the first and second fan inlets and blow air out the fan outlet. The sensor device may include a sensor inlet, a sensor outlet, and a cover. The sensor may be coupled to the fan with the first fan inlet collocated with the sensor outlet such that air drawn into the first fan inlet is first drawn through the sensor inlet. The cover may be configured in a first position to cover the sensor inlet to permit no air flow through the sensor inlet and in a second position to uncover the sensor inlet to permit air to flow through the sensor inlet.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
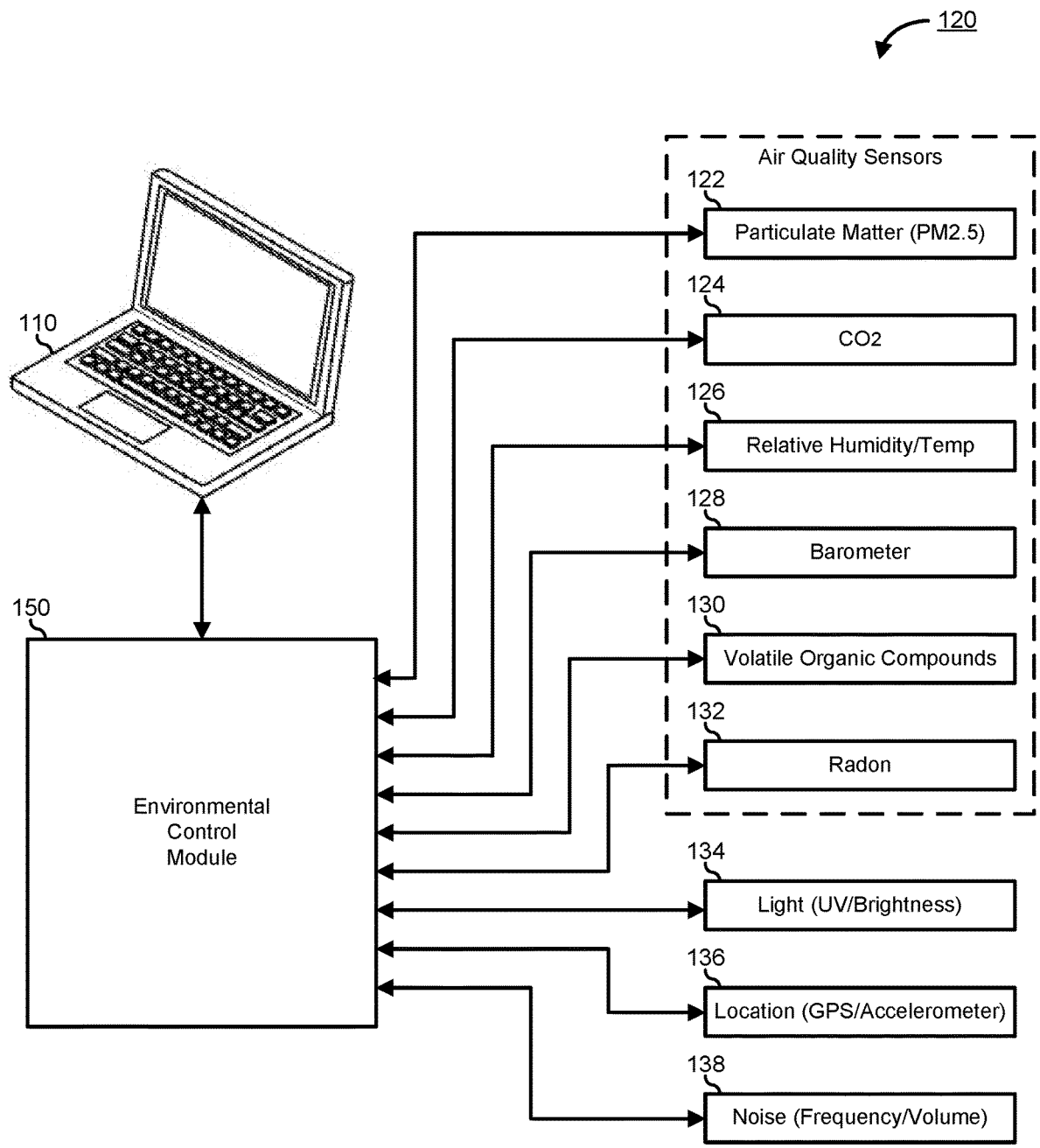
FIG. 1 is a block diagram illustrating an information handling system according to an embodiment of the current disclosure.

FIG. 1 illustrates a green processing system 100. Green processing system 100 represents an element of processing equipment that is designed and manufactured in accordance with various environmental sustainability goals, such as increased use of recycled and recyclable materials or materials that otherwise carry a lower carbon footprint in their manufacture, lower power consumption technologies, and the like. In a particular embodiment, green processing system 100 is configured to monitor the processing environment in which the green processing system is utilized, or is projected to be utilized through the inclusion of various environmental sensors, and to dynamically adjust the data acquisition rates for environmental sensors, thereby reducing system resource load, lowering overall energy usage, and improving battery usage.

Green processing system 100 includes an information handling system 110 that includes environmental sensors 120 and an environmental control module 150. Information handling system 110 represents a wide variety of types of computer systems, as needed or desired. As illustrated, information handling system 110 represents a laptop computer system, but the information handling system may be understood more broadly to represent other consumer oriented computer systems, such as tablet devices, cellular devices, smart phone, home desktop systems, other consumer oriented computer systems, as needed or desired. Moreover, information handling system 110 may be understood to represent a wide variety of types of commercial computer systems, such as slim client systems, workstations, office server systems, or other commercial computer systems, as needed or desired. Further, in its capacity to monitor and manage power consumption or processing resources, as described below, the teachings of the current disclosure may further be applied to datacenter equipment, such as server systems, blade- or sled-based processing systems, storage racks, I/O racks, switching racks, or other datacenter equipment, as needed or desired.

Environmental sensors 120 include various air quality sensors including a particulate matter sensor 122, a $CO_2$ sensor 124, a relative humidity/temperature sensor 126, a barometric pressure sensor 128, a volatile organic compound (VOC) sensor 130, and a radon sensor 132. Particulate matter sensor 122 represents a sensor that detects the presence of fine particulate matter in the ambient air around green processing system 100. Fine particulate matter may include soot, dust, smoke, dirt, pollen, and the like. Fine particulate matter is typically measured in micrometers, and current environmental standards are concerned with fine particulate matter that is less than two and one-half micrometers in diameter. Hence a common particulate matter sensor may be designated as a PM2.5 sensor. $CO_2$ sensor 124 detects the amount of $CO_2$ in the ambient air around green processing system 100.

Relative humidity/temperature sensor 126 and barometric pressure sensor 128 represent sensors to detect atmospheric conditions, either as a function of the weather in the area of green processing system 100, or as a result of the environmental conditioning in the vicinity of the green processing system. VOC sensor 128 represents a sensor that detects airborne chemicals. VOCs may include acetone, acetic acid, butanal, carbon disulfide, ethanol, alcohol, formaldehyde, methylene chloride, sulfur, or other compounds. VOCs may be present in the ambient air surrounding green processing system 100, or may be outgassed from materials in the vicinity of the green processing system.

Other environmental sensors 120 include a light sensor 134, a location sensor 136, and a noise sensor 138. Light sensor 134 represents a photodetector that operates to detect light in the ambient environment of green processing system 100, and can include detectors for detecting the spectrum of the ambient light, including in the ultraviolet (UV) range, and can detect the brightness of the ambient light. Location sensor 136 represents various positional sensors of green processing system 100, including a global positioning system (GPS), a wide area network (WAN) locator system, an accelerometer or other motion detector whereby the green processing system can determine relative location with respect to a fixed location determined by the GPS or WAN locator system, or other sensors configured to determine the location of the green processing system. Noise sensor 138 represents a microphone or other sound receiving sensor that can determine a frequency spectrum of the received sound in the ambient environment of green processing system 100, the volume of the received sound, or the like.

Each of sensors 120 may consume power within green processing system 100, based upon the receipt and analysis of the various environmental factors measured by the various sensors. For example, while operating particulate matter sensor 122 and $CO_2$ sensor 124 may consume on the order of six hundred milliwatts (mW) of power. Other sensors 120 may similarly consume power within green processing system 100. As such, operating all of sensors 120 simultaneously may result in an undue burden on the power resources of green processing system 100, such as a battery or the like. Thus, it may be desirable to determine a sampling frequency for each of sensors 120, based upon the type of ambient condition that is being measured, and the rate at which such conditions are likely to change. Moreover, each of sensors 120 may be understood to necessitate the consumption of system resources of information handling system 110, such as processor cycles, memory resources, memory and I/O bandwidth, and the like. In particular, each one of sensors 120 may be associated with its own driver or other application programming interface (API) that utilizes processing resources to run. Thus, as with the power consumption described above, it may be desirable to minimize the amount of sampling done by each of sensors 120 in order to reduce the processing load on information handling system 110.

Sensors 120 are each connected to environmental control module 150. Here, environmental control module 150 may be understood to represent hardware needed to interface with one or more of sensors 120, software, such as drivers and APIs needed to operate the sensors, or a combination thereof. In addition, environmental control module 150 operates to manage the sampling frequencies of sensors 120, the power consumed by the sensors, the processing resources consumed by the sensors, and the like. As described further below, environmental control module 150 further operates to leverage historical data from sensors 120, user location and location history data, external data resources, and the like, to modify the sampling frequencies, the power consumption, and the processing resource consumption of sensors 120 in order to intelligently optimize the performance of the sensors and of information handling system 110, and to improve the experience of the user of green processing system 100.

Figure 2:
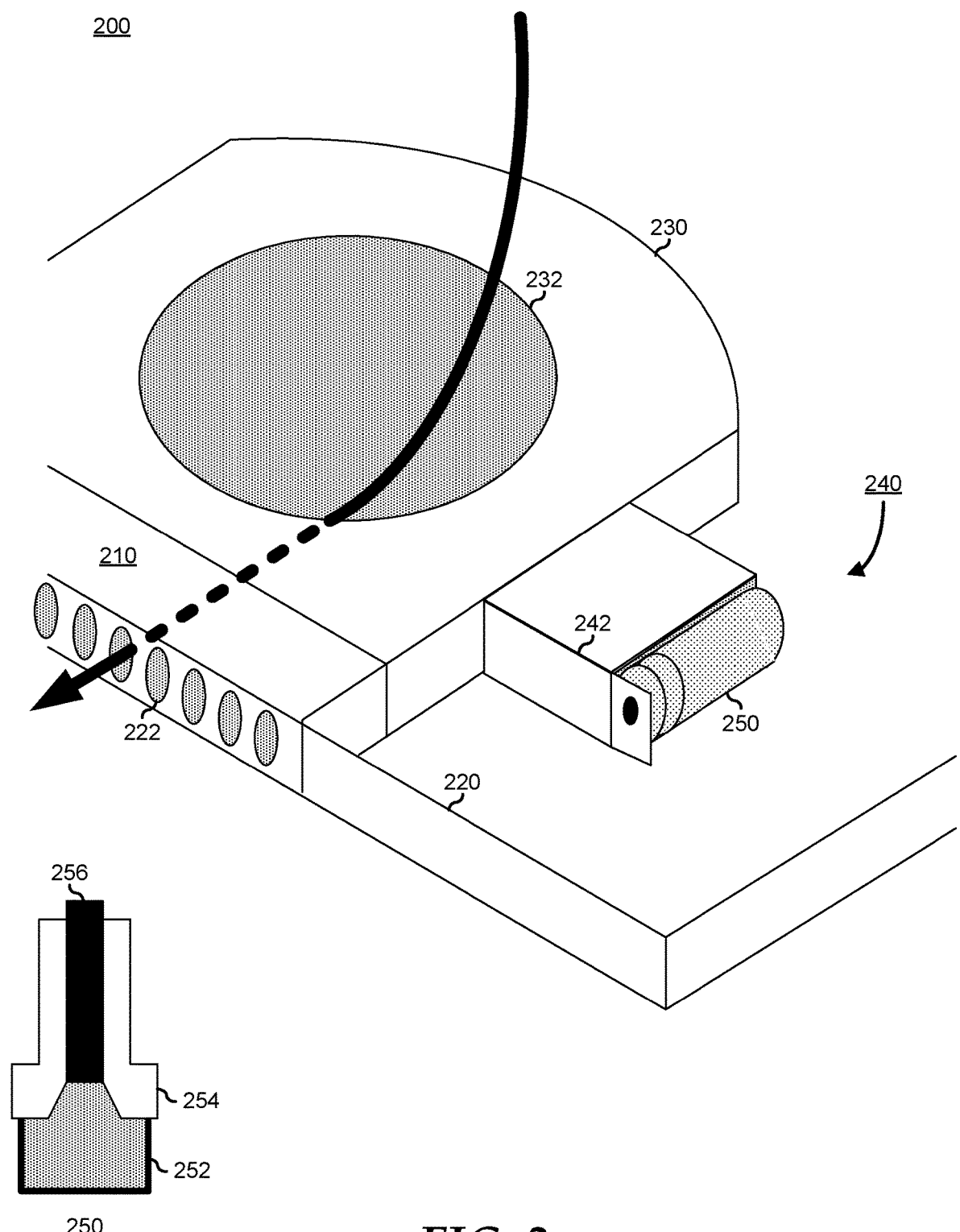
FIGS. 2 and 3 are views of an information handling system according to an embodiment of the current disclosure.

FIG. 2 illustrates an information handling system 200 similar to information handling system 110. Information handling system 200 includes a heat-generating component 210 installed within a case 220. Component 210 is cooled by a cooling fan 230. Cooling fan 230 includes a fan inlet 232 to receive cool air, and one or more fan outlet, not illustrated, that is located to blow the cool air over component 210. The cool air removes heat from component 210 and the heated air is blown out of one or more case outlet 222, thereby removing the heat from component 210. In a particular embodiment, fan inlet 232 is situated at a bottom side of case 220, such that ambient air is drawn into fan 230 via the fan inlet, and FIG. 2 will be understood to be a bottom-view.

In another embodiment, fan inlet 232 is situated within case 220. Here, ambient air will be understood to be drawn in via one or more case inlet, not illustrated, and the ambient air may provide a degree of cooling for other components of information handling system 200 before cooling component 210. Here, FIG. 2 may be understood to be a top-view or a bottom-view, as needed or desired. In yet another embodiment, the air from component 210 may be utilized to cool other components of information handling system 200 prior to being blown out of case outlet 222. The design of airflow to cool components of an information handling system, the placement of fans, air inlets, and air outlets, and the like, and other aspects of cooling systems of an information handling system are known in the art and will not be further described herein, except as needed to illustrate the current embodiments.

Information handling system 200 further includes a sensor 240 similar any one of sensors 120. In particular, sensor 240 represents a sensor that utilizes air flow to detect the associated environmental factor. As such, sensor 240 will be understood to include a sensor element that detects the particular environmental factor from the air flowing through the sensor. Sensor 240 includes a movable cover 242 and a wax motor 250. Sensor 240 includes a sensor outlet, not illustrated, and the sensor is affixed to fan 230, such that a second inlet of the fan, not illustrated, is collocated with the sensor outlet. Sensor 240 operates such that, when wax motor 250 is in a first state, cover 242 is in a closed position over a sensor inlet to prevent the ambient air from flowing through the sensor element. Sensor 240 further operates such that, when the wax motor is in a second state, cover 242 is in an open position over the sensor inlet to permit the ambient air to flow through the sensor element. Here, the ambient air is drawn into fan 230 by the second inlet, and the flow of ambient air from sensor 240 is added to the air flowing through component 210 and out case outlet 222.

Figure 3:
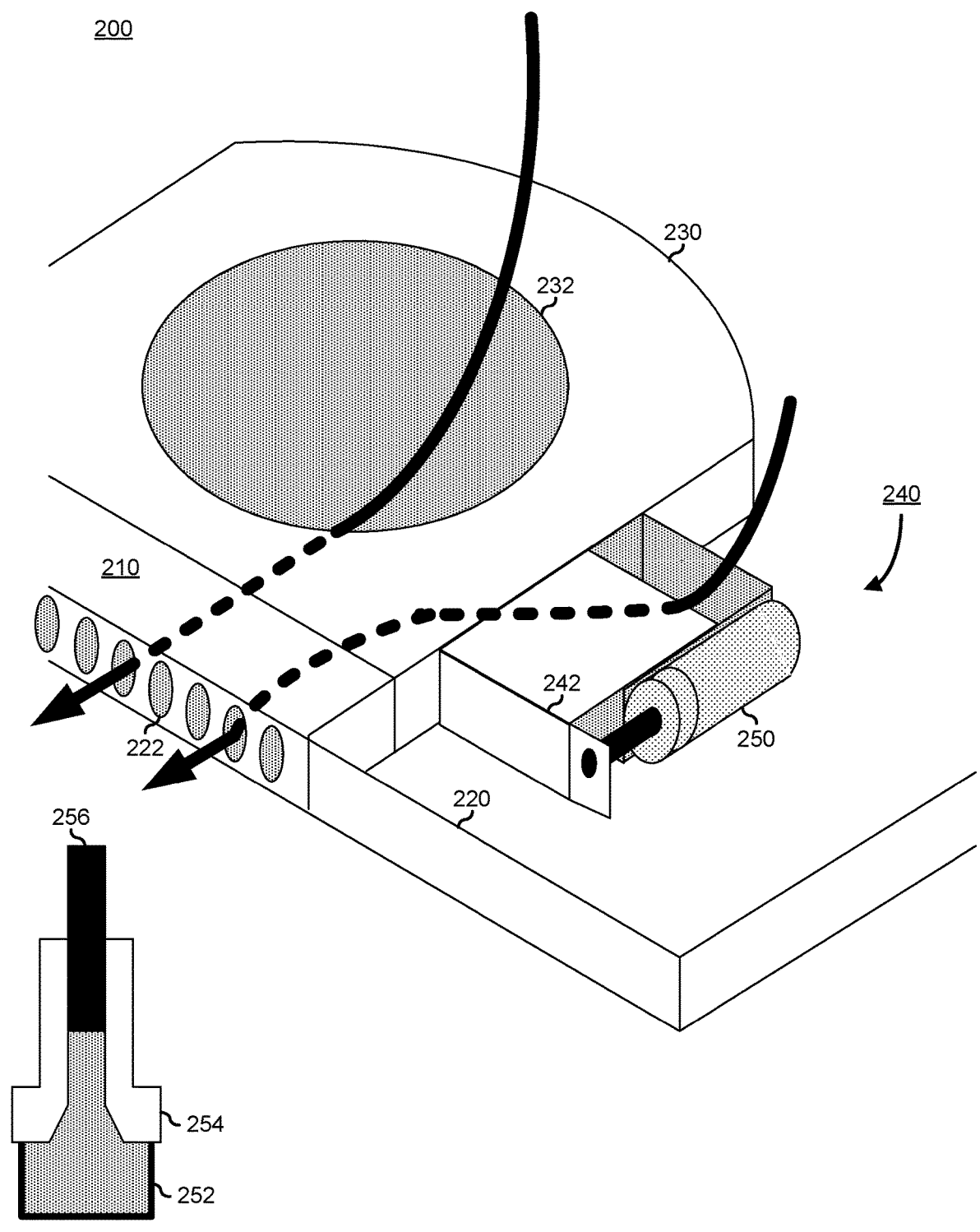

Wax motor 250 represents a linear actuator that is controlled to be in an off-state or an on-state, such that thermal energy in a material produces a phase change in the material, and the phase change results in the movement of an actuator. For example, the thermal energy may be generated by the actuation of a heating element or the passing of a current through the wax motor. Wax motor 250 is illustrated in FIG. 2 in the off-state. Here a wax 252 is cooled, and hence contracted into a case 254 of wax motor 250, thereby drawing an actuator 256 in towards the wax motor. Actuator 256 is mechanically attached to cover 242, such that the drawn-in actuator causes the cover to close over the sensor inlet. Wax motor 250 is illustrated in FIG. 3 in the on-state. Here wax 252 is heated, causing the wax to expand into case 254, thereby pushing actuator 256 outwardly from the wax motor. Here the pushing-out of actuator 256 causes the cover to open, permitting air flow through the sensor element.

Wax motor 250 may be controlled by an electrical control signal from an environmental controller similar to environmental control module 150. When the environmental control module determines to sample the ambient air, the environmental control module turns on wax motor 250 to open cover 242 to permit the ambient air to flow through the sensor element. Here, the use of a wax motor is illustrative, and is not intended to be limiting as to the mechanism for opening or closing a cover of a sensor. More generally, other types of linear actuators may be utilized, including a bi-metal temperature actuated mechanism, a barometric actuator, or another actuator, as needed or desired.

In a particular embodiment, sensor 240 represents a particle detector, such as a PM2.5 particle detector. Here, sensor 240 may be able to detect particles as small as two point five micrometers across, that may include small dust particles, fibers, composite resins, and the like. Here further, in addition to information handling system 200 being configured to manage and provide user updates as to the ambient environment surrounding the information handling system, sensor 240 may provide information to a manufacturer of the information handling system as to the amount of contaminants in the ambient environment of the information handling system, and the historical rates of such contaminants. For example, where a manufacturer of an information handling system provides sustainability targets for the life of the information handling system, telemetry data from a PM2.5 particle detector may contribute to the sustainability and longevity of the information handling system.

By analyzing telemetry data from a PM2.5 particle detector over time, a service branch of the manufacturer may be able to proactively warn a user of the information handling system when dust buildup or exposure to corrosive materials threatens to impact the usability, performance, or reliability of the information handling system. For example, when a large number of dust particles are detected in the ambient environment surrounding the information handling system, the information handling system may provide periodic updates to the manufacturer, for example via a service portal API installed on the information handling system, and the manufacturer may provide recommendations for cleaning of the information handling system, the fans and vent holes of the information handling system, or the like, or to periodically replace various components of the information handling system. Further, as manufacturers implement various right-to-repair agreements with their user base, such recommendations may be an important factor in maintaining and improving customer satisfaction with the manufacturer's products.

Figure 4:
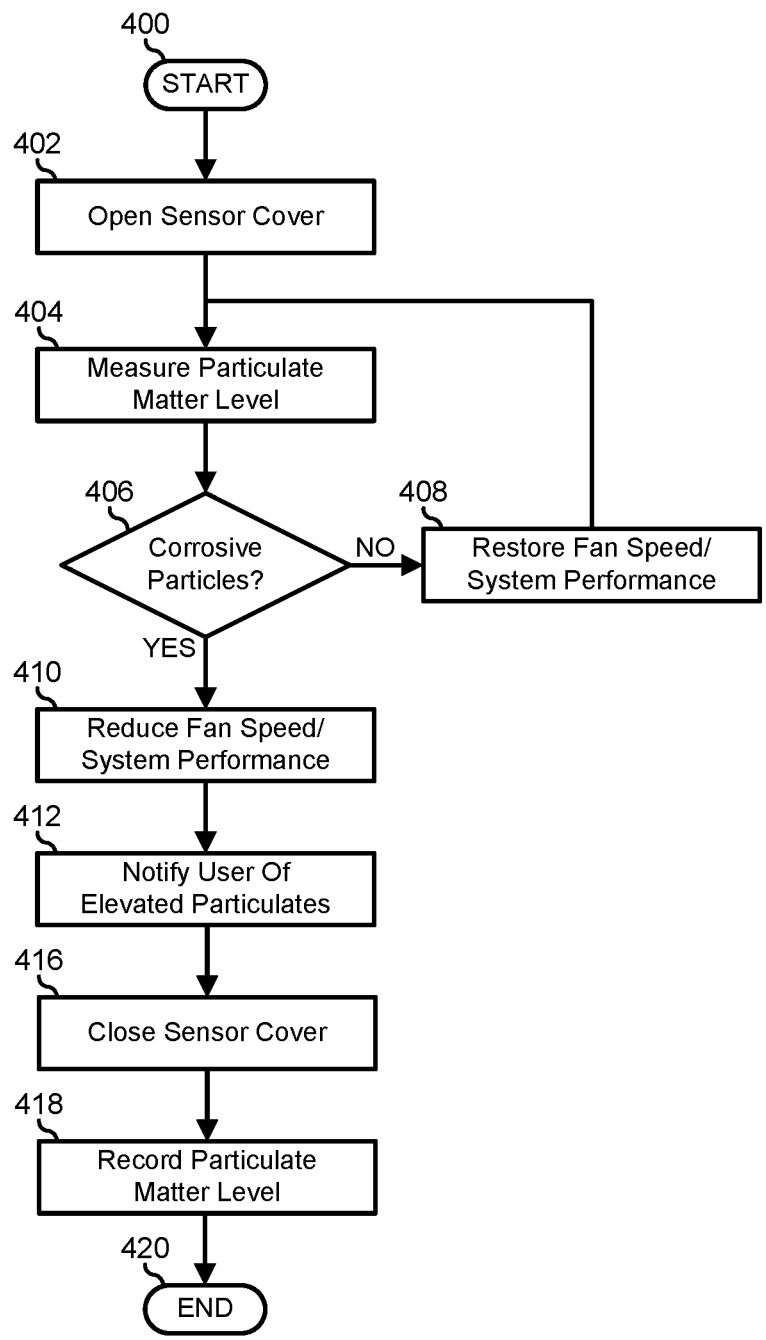
FIG. 4 is a flowchart illustrating a method for measuring and controlling dust ingress in a particulate matter sensor in an information handling system according to an embodiment of the current disclosure.

FIG. 4 illustrates a method for measuring and controlling dust ingress in a particulate matter sensor in an information handling system, starting at block 400. A sensor cover for a particulate matter sensor is opened in block 402 and the particulate matter level is measured in block 404. A decision is made as to whether or not corrosive particles are present in the measured level of particulate matter in decision block 406. If not, the "NO" branch of decision block 406 is taken, the system fan speed is restored to a normal operating speed and the system performance level is restored to a normal performance level in block 408, and the method returns to block 404 where the particulate matter level is measured. If corrosive particles are present in the measured level of particulate matter, the "YES" branch of decision block 406 is taken, and the system fan speed is reduced and the system performance level is reduced in block 410. A user is notified of the presence of the corrosive particles and that the system fan speed and performance level have been reduced in block 412. The sensor cover is closed in block 416, the measured particulate level is recorded in a database in block 418, and the method ends in block 420.

Figure 5:
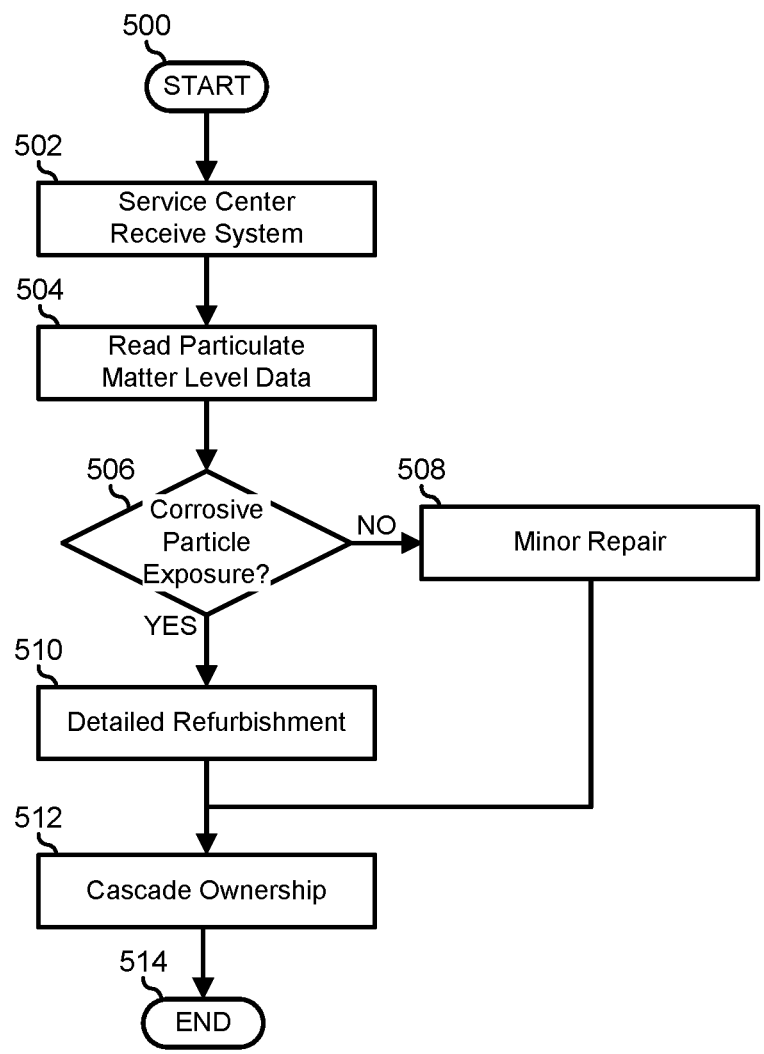
FIG. 5 is a flowchart illustrating a method for providing cascading ownership of an information handling system based upon particulate matter sensor data according to an embodiment of the current disclosure.

FIG. 5 illustrates a method for providing cascading ownership of an information handling system based upon particulate matter sensor data starting at block 500. An information handling system is received by a service center in block 502. Here, the service center receives the information handling system for the purposes of refurbishment, restoration, or reconditioning for reuse by another user than the user from which the information handling system was received. The particulate matter level history is read from a database on the information handling system in block 504. A decision is made as to whether or not the information handling system was exposed to corrosive particles in decision block 506.

Decision block 504 may represent a determination of an absolute exposure to corrosive particles, or a determination that a positive exposure to corrosive particles is further associated with a determination that the level of exposure to corrosive particles exceeds a threshold. If the information handling system was not exposed to corrosive particles, the "NO" branch of decision block 506 is taken, minor repairs are performed on the information handling system as needed in block 508, the information handling system is prepared for cascaded ownership in block 512, and the method ends in block 514. If the information handling system was exposed to corrosive particles, the "YES" branch of decision block 506 is taken, detailed repairs associated with exposure to corrosive particles are performed on the information handling system as needed in block 510, the information handling system is prepared for cascaded ownership in block 512, and the method ends in block 514.

Figure 6:
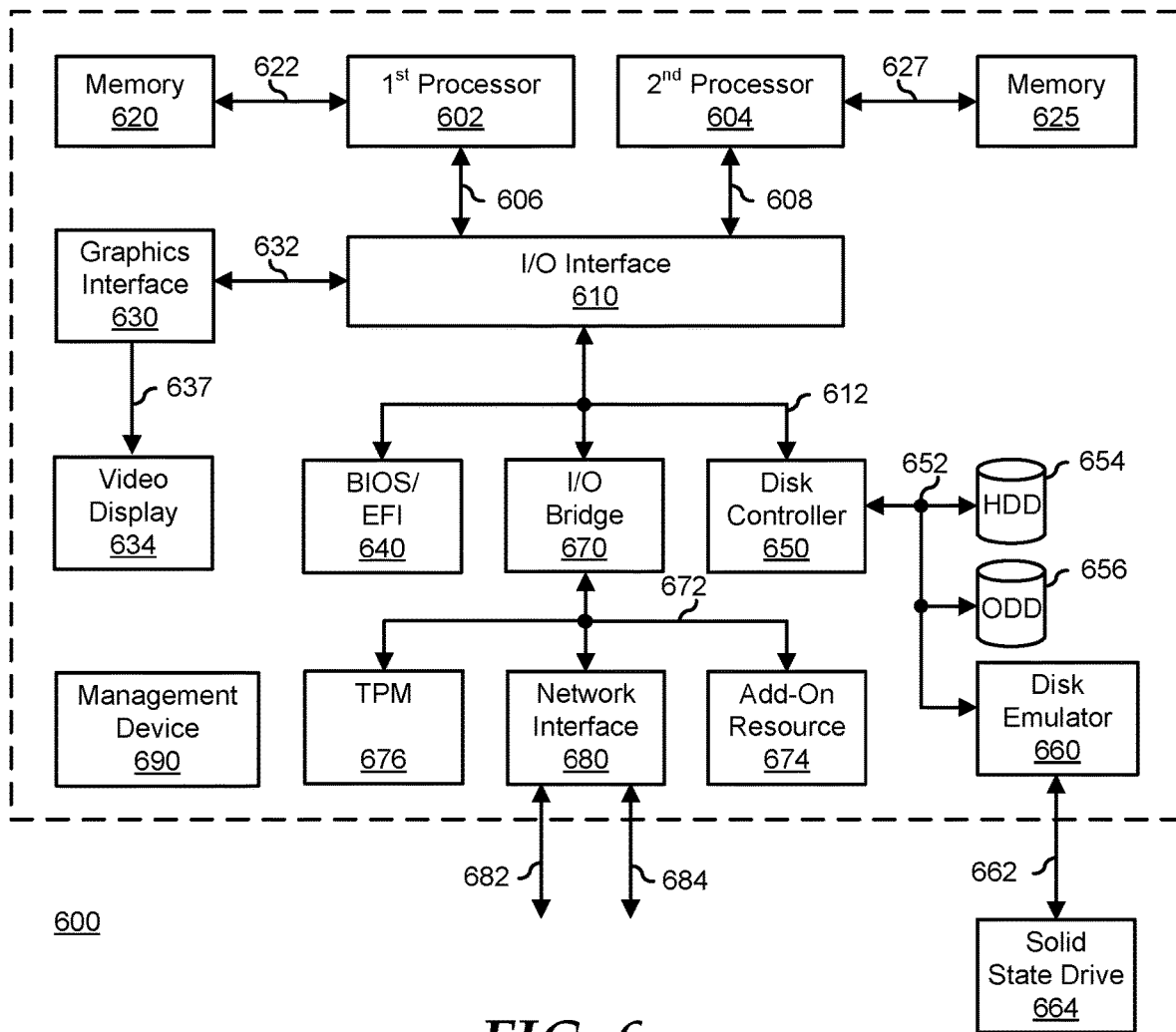
FIG. 6 is a block diagram illustrating a generalized information handling system according to another embodiment of the present disclosure.

FIG. 6 illustrates a generalized embodiment of an information handling system 600. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 600 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 600 can include processing resources for executing machine-executable code, such as a central processing unit (CPU), a programmable logic array (PLA), an embedded device such as a System-on-a-Chip (SoC), or other control logic hardware. Information handling system 600 can also include one or more computer-readable medium for storing machine-executable code, such as software or data. Additional components of information handling system 600 can include one or more storage devices that can store machine-executable code, one or more communications ports for communicating with external devices, and various input and output (I/O) devices, such as a keyboard, a mouse, and a video display. Information handling system 600 can also include one or more buses operable to transmit information between the various hardware components.

Information handling system 600 can include devices or modules that embody one or more of the devices or modules described below, and operates to perform one or more of the methods described below. Information handling system 600 includes a processors 602 and 604, an input/output (I/O) interface 610, memories 620 and 625, a graphics interface 630, a basic input and output system/universal extensible firmware interface (BIOS/UEFI) module 640, a disk controller 650, a hard disk drive (HDD) 654, an optical disk drive (ODD) 656, a disk emulator 660 connected to an external solid state drive (SSD) 662, an I/O bridge 670, one or more add-on resources 674, a trusted platform module (TPM) 676, a network interface 680, a management device 690, and a power supply 695. Processors 602 and 604, I/O interface 610, memory 620, graphics interface 630, BIOS/UEFI module 640, disk controller 650, HDD 654, ODD 656, disk emulator 660, SSD 662, I/O bridge 670, add-on resources 674, TPM 676, and network interface 680 operate together to provide a host environment of information handling system 600 that operates to provide the data processing functionality of the information handling system. The host environment operates to execute machine-executable code, including platform BIOS/UEFI code, device firmware, operating system code, applications, programs, and the like, to perform the data processing tasks associated with information handling system 600.

In the host environment, processor 602 is connected to I/O interface 610 via processor interface 606, and processor 604 is connected to the I/O interface via processor interface 608. Memory 620 is connected to processor 602 via a memory interface 622. Memory 625 is connected to processor 604 via a memory interface 627. Graphics interface 630 is connected to I/O interface 610 via a graphics interface 632, and provides a video display output 636 to a video display 634. In a particular embodiment, information handling system 600 includes separate memories that are dedicated to each of processors 602 and 604 via separate memory interfaces. An example of memories 620 and 630 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 640, disk controller 650, and I/O bridge 670 are connected to I/O interface 610 via an I/O channel 612. An example of I/O channel 612 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 610 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/UEFI module 640 includes BIOS/UEFI code operable to detect resources within information handling system 600, to provide drivers for the resources, initialize the resources, and access the resources. BIOS/UEFI module 640 includes code that operates to detect resources within information handling system 600, to provide drivers for the resources, to initialize the resources, and to access the resources.

Disk controller 650 includes a disk interface 652 that connects the disk controller to HDD 654, to ODD 656, and to disk emulator 660. An example of disk interface 652 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 660 permits SSD 664 to be connected to information handling system 600 via an external interface 662. An example of external interface 662 includes a USB interface, an IEEE 1394 (Firewire) interface, a proprietary interface, or a combination thereof. Alternatively, solid-state drive 664 can be disposed within information handling system 600.

I/O bridge 670 includes a peripheral interface 672 that connects the I/O bridge to add-on resource 674, to TPM 676, and to network interface 680. Peripheral interface 672 can be the same type of interface as I/O channel 612, or can be a different type of interface. As such, I/O bridge 670 extends the capacity of I/O channel 612 when peripheral interface 672 and the I/O channel are of the same type, and the I/O bridge translates information from a format suitable to the I/O channel to a format suitable to the peripheral channel 672 when they are of a different type. Add-on resource 674 can include a data storage system, an additional graphics interface, a network interface card (NIC), a sound/video processing card, another add-on resource, or a combination thereof. Add-on resource 674 can be on a main circuit board, on separate circuit board or add-in card disposed within information handling system 600, a device that is external to the information handling system, or a combination thereof.

Network interface 680 represents a NIC disposed within information handling system 600, on a main circuit board of the information handling system, integrated onto another component such as I/O interface 610, in another suitable location, or a combination thereof. Network interface device 680 includes network channels 682 and 684 that provide interfaces to devices that are external to information handling system 600. In a particular embodiment, network channels 682 and 684 are of a different type than peripheral channel 672 and network interface 680 translates information from a format suitable to the peripheral channel to a format suitable to external devices. An example of network channels 682 and 684 includes InfiniBand channels, Fibre Channel channels, Gigabit Ethernet channels, proprietary channel architectures, or a combination thereof. Network channels 682 and 684 can be connected to external network resources (not illustrated). The network resource can include another information handling system, a data storage system, another network, a grid management system, another suitable resource, or a combination thereof.

Management device 690 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 600. In particular, management device 690 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 600, such as system cooling fans and power supplies. Management device 690 can include a network connection to an external management system, and the management device can communicate with the management system to report status information for information handling system 600, to receive BIOS/UEFI or system firmware updates, or to perform other task for managing and controlling the operation of information handling system 600. Management device 690 can operate off of a separate power plane from the components of the host environment so that the management device receives power to manage information handling system 600 when the information handling system is otherwise shut down. An example of management device 690 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 690 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system, comprising:
   a case having a case inlet and a case outlet;
   a fan to cool the information handling system, the fan including a first fan inlet, a second fan inlet, and a fan outlet, the fan configured to draw air into the first and second fan inlets from the case inlet and to blow air out the fan outlet to the case outlet; and
   a sensor device including a sensor inlet, a sensor outlet, a cover, and a linear actuator, wherein the sensor is coupled to the fan with the first fan inlet collocated with the sensor outlet such that air drawn into the first fan inlet is first drawn through the sensor inlet, wherein the cover is configured in a first position to cover the sensor inlet to permit no air flow through the sensor inlet and is configured in a second position to uncover the sensor inlet to permit air to flow through the sensor inlet, and wherein the linear actuator is configured in a first state to situate the cover in the first position and is configured in a second state to situate the cover in the second position.

2. The information handling system of claim 1, further comprising:
   a controller configured to activate the linear actuator in one of the first state and the second state.

3. The information handling system of claim 2, wherein the linear actuator includes a wax motor.

4. The information handling system of claim 3, wherein when the controller activates the linear actuator in the first state, the controller is further configured to remove a current to the wax motor to cool a wax actuator of the wax motor, and when the controller activates the linear actuator in the second state, the controller is further configured to apply the current to the wax motor to heat the wax actuator.

5. The information handling system of claim 1, wherein the sensor device comprises a particle detector.

6. The information handling system of claim 5, wherein the particle detector is configured to detect particles as small as 2.5 micrometers.

7. The information handling system of claim 5, wherein the particle detector is configured to detect corrosive particles.

8. The information handling system of claim 7, wherein the information handling system is configured to determine the presence of the corrosive particles, and to lower a fan speed of the fan in response to determining the presence of the corrosive particles.

9. The information handling system of claim 8, wherein the information handling system is further configured to set the cover into the first position in further response to determining the presence of corrosive particles.

10. A method, comprising:
    providing, in a case of an information handling system, a case inlet and a case outlet;
    cooling, by a fan of the information handling system, a component of the information handling system, the fan including a first fan inlet, a second fan inlet, and a fan outlet, the fan configured to draw air into the first and second fan inlets from the case inlet and to blow air out the fan outlet to the case outlet;
    opening, by a cover of a sensor of the information handling system, a sensor inlet, wherein the sensor is coupled to the fan with the first fan inlet collocated with a sensor outlet of the sensor such that air drawn into the first fan inlet is first drawn through the sensor inlet when the sensor inlet is opened by the cover, and wherein opening the sensor inlet includes setting, by a linear actuator coupled to the cover, the linear actuator into a first state; and
    closing the sensor inlet, such that no air flows through the sensor inlet when the sensor inlet is closed by the cover, wherein closing the sensor inlet includes setting the linear actuator into a second state.

11. The method of claim 10, further comprising:
    activating, by a controller of the information handling system, the linear actuator into the first state; and
    activating the linear actuator into the second state.

12. The method of claim 11, wherein the linear actuator includes a wax motor.

13. The method of claim 12, further comprising:
in response to activating the linear actuator into the first state, removing a current to the wax motor to cool a wax actuator of the wax motor; and
in response to activating the linear actuator into the second state, applying the current to the wax motor to heat the wax actuator.

14. The method of claim 10, wherein the sensor device comprises a particle detector.

15. The method of claim 14, wherein the particle detector is configured to detect particles as small as two and one-half micrometers.

16. The method of claim 14, wherein the particle detector is configured to detect corrosive particles.

17. The method of claim 16, further comprising:
determining the presence of the corrosive particles; and
in response to determining the presence of the corrosive particles:
lowering a fan speed of the fan; and
setting the cover into the first position.

18. A fan to cool a component of an information handling system, the fan comprising:
a first fan inlet;
a second fan inlet;
a fan outlet, wherein the fan is configured to draw air into the first and second fan inlets from a case inlet of the information handling system and to blow air out the fan outlet to a case outlet of the information handling system;
a sensor device including a sensor inlet, a sensor outlet, a cover, and a linear actuator coupled to the cover, wherein the sensor is coupled to the fan with the first fan inlet collocated with the sensor outlet such that air drawn into the first fan inlet is first drawn through the sensor inlet, wherein the cover is configured in a first position to cover the sensor inlet to permit no air flow through the sensor inlet and is configured in a second position to uncover the sensor inlet to permit air to flow through the sensor inlet, and wherein the linear actuator is configured in a first state to situate the cover in the first position and is configured in a second state to situate the cover in the second position; and
a controller configured to activate the linear actuator in one of the first state and the second state.

19. The information handling system of claim 18, wherein the linear actuator includes a wax motor.

20. The information handling system of claim 19, wherein when the controller activates the linear actuator in the first state, the controller is further configured to remove a current to the wax motor to cool a wax actuator of the wax motor, and when the controller activates the linear actuator in the second state, the controller is further configured to apply the current to the wax motor to heat the wax actuator.

* * * * *